(12) United States Patent
Faist et al.

(10) Patent No.: US 9,293,531 B2
(45) Date of Patent: Mar. 22, 2016

(54) SEMICONDUCTOR COMPONENT COMPRISING MICRO-BRIDGES FOR ADJUSTING A TENSILE STRAIN STATE AND METHOD FOR THE PRODUCTION THEREOF

(75) Inventors: Jerome Faist, Zürich (CH); Gustav Schiefler, Zürich (CH); Hans Christian Sigg, Mettmenstetten (CH); Ralph Spolenak, Zürich (CH); Martin Süss, Zürich (CH)

(73) Assignees: PAUL SCHERRER INSTITUT, Villigen Psi (CH); ETH ZUERICH, Zurich (CH)

( * ) Notice: Subject to any disclaimer, the term of this patent is extended or adjusted under 35 U.S.C. 154(b) by 39 days.

(21) Appl. No.: 14/119,939

(22) PCT Filed: May 4, 2012

(86) PCT No.: PCT/EP2012/058241
§ 371 (c)(1),
(2), (4) Date: Mar. 21, 2014

(87) PCT Pub. No.: WO2012/159869
PCT Pub. Date: Nov. 29, 2012

(65) Prior Publication Data
US 2014/0197375 A1    Jul. 17, 2014

(30) Foreign Application Priority Data

May 24, 2011  (EP) .................................... 11004279
Feb. 1, 2012  (EP) .................................... 12153466

(51) Int. Cl.
| | | |
|---|---|---|
| *H01L 29/49* | (2006.01) | |
| *H01L 29/06* | (2006.01) | |
| *H01L 21/8238* | (2006.01) | |
| *H01L 21/3065* | (2006.01) | |
| *H01L 29/66* | (2006.01) | |

(52) U.S. Cl.
CPC ........ *H01L 29/0657* (2013.01); *H01L 21/3065* (2013.01); *H01L 21/823807* (2013.01); *H01L 29/66977* (2013.01)

(58) Field of Classification Search
CPC ................... H01L 29/0657; H01L 29/823807; H01L 29/3065; H01L 29/66977
See application file for complete search history.

(56) References Cited

U.S. PATENT DOCUMENTS

| | | | |
|---|---|---|---|
| 6,571,629 B1 | 6/2003 | Kipp et al. | |
| 6,858,888 B2 | 2/2005 | Lal et al. | |
| 7,838,950 B2 | 11/2010 | Detlev | |
| 2010/0057381 A1 | 3/2010 | Pardoen et al. | |
| 2010/0290217 A1 | 11/2010 | Anantram et al. | |
| 2013/0020707 A1* | 1/2013 | Or-Bach et al. | ............... 257/741 |

FOREIGN PATENT DOCUMENTS

| | | |
|---|---|---|
| WO | 03045837 A2 | 6/2003 |
| WO | 2004089811 A2 | 10/2004 |
| WO | 2007093018 A2 | 8/2007 |

* cited by examiner

*Primary Examiner* — Michael Shingleton
(74) *Attorney, Agent, or Firm* — Laurence Greenberg; Werner Stemer; Ralph Locher

(57) ABSTRACT

A tensile strain state in semiconductor components is adjusted. A pretensioned (tensile strain) layer is applied to a substrate (FIG. 1, (A)). Bridge structures (FIG. 1, (B)) are introduced in the layers by lithography and etching. The bridges are connected to the layer on both sides and are thus continuous. The geometric shape of the bridges, formed with a cross-section modulation, is determined by the windows (FIG. 1 (C)) in the layer. When the substrate is etched selectively, the bridge is undercut through the windows. The geometric structuring of the cross-section (FIG. 1, (D)) causes a redistribution of the originally homogeneous strain when the bridges are detached from the substrate, with the larger cross-sections relaxing at the expense of the smaller cross-sections, where the pretension is increased. Only a multiplication of stresses (or strain) originally present in the sample is possible, with the multiplication factor determined by lengths, widths and depths, and/or the relationships thereof.

8 Claims, 4 Drawing Sheets

3D representation of free-floating bridge, schematic

Schematic representation of the inhomogeneous strain modulation by patterning and undercutting: lines schematically represent the lattice planes 3D representation of free-floating bridge, schematic

SEMICONDUCTOR COMPONENT COMPRISING MICRO-BRIDGES FOR ADJUSTING A TENSILE STRAIN STATE AND METHOD FOR THE PRODUCTION THEREOF

BACKGROUND OF THE INVENTION

Field of the Invention

The present invention relates to a semiconductor component comprising microbridges for adjusting a tensile strain state and to a method for the production thereof.

Electronic devices such as computers, for example, are of central importance for various reasons. The growth in computing capacity, with a concomitant reduction in size and weight, that has been observable since the development of the transistor, is known as Moore's Law. In recent years there has been a noticeable deviation from this law in the direction of lower growth in computing capacity. The most promising approaches for achieving further increases include silicon straining as a means of improving charge carrier mobility and combining electronics with photonics.

The latter makes it possible to use light to control the intercommunication between the cores of multicore processors on which the growth in computing capacity has often depended in recent years. For this purpose various optical components and switching elements are required, some of which have already been realized, such as wavequides, detectors and also modulators based on charge carrier injection. What is currently still lacking is a material, compatible with established silicon-based electronics, for transmitting optical impulses for the purpose of information transfer. Thus, for example, a laser light source is based on the recombination of electrons in the conduction band with associated hole states in the valence band, but there are also no high-speed optical modulators based on receivers of nonlinear light generation.

The latter method makes it possible, for example, to link the signals of two different optical channels.

As is well known, silicon is an indirect bandgap material and the coupling with photons (light) is weak. Therefore, the above mentioned optical components, the so-called interband laser and also high-speed modulators based on the Stark effect have not been implemented. The symmetry of unstrained silicon also prohibits nonlinear light coupling. Similar limitations also apply to germanium, as well as to all silicon-germanium alloys ($Si_xGe_{1-x}$).

However, the particular feature of germanium as compared to silicon is that optical excitations (the reverse of the above mentioned recombination process) from the valence to the conduction band are very efficient despite the indirect bandgap. In energy terms, the direct conduction band, the so-called gamma minimum, is some 20% above the indirect conduction band, the so-called L-minimum. Efficient detectors can therefore be realized in germanium; however, a direct bandgap would be necessary in order to construct an efficient laser based on charge carrier recombination.

Theoretical considerations and calculations now predict that, beyond a particular tensile strain level, germanium actually has a direct bandgap and could the be a suitable laser material. The degree of tensile strain required is a function of the type of stress applied, the crystallographic orientation, and the model on which the calculation is based. As a representative of the fourth main group, germanium has the same crystal structure as silicon and similar chemical properties, and is therefore a candidate for monolithic integration into the prevailing silicon technology.

In any event, it has so far not been possible to impart sufficient tensile strain to germanium to produce a direct bandgap. However, lasing has been demonstrated in germanium, the lack of tensile strain being compensated by n-doping.

However, tensile straining is not only leading to new applications for germanium, but it has also been predicted that the electrical properties in silicon can be improved by suitable straining. This applies in particular to n-doped silicon where tensile straining could result in a dramatic increase in mobility. Here too, as in the case with germanium, appropriate strain values have yet to be achieved.

The present invention provides a mechanism, and use thereof, allowing precise adjustment of a tensile strain state in pre-strained germanium, or another pre-strained material such as silicon, including layer systems, by means of patterning and microprocessing. Of particular importance here is the planar layout enabling it to be used in photonics (e.g. waveguides, modulators, etc.) and also electronics (transistors).

In the prior art there are currently a number of approaches for adjusting the tensile strain in germanium or other materials. This is used not only to alter the band structure (band structure engineering) but in some cases also to measure the tensile strain properties of metals or insulators.

Rapid Thermal Annealing

When the temperature of two connected materials changes, strains are produced because of their different expansion. coefficients. This is a known feature of bimetallic elements. Both can be used to adjust the strain state, and this is, for example, the mechanism for increasing the tensile strain in the germanium lasers demonstrated hitherto. However, this method has so far failed to produce sufficient deformation to be able to produce a direct bandgap in germanium through tensile strain. alone.

Growth Strain in Epitaxial Deposition

When a material is deposited on a substrate, growth strain is produced. because of the different lattice constants of the materials involved. The deposition of germanium on silicon generally results in compressive strain, as the lattice constant of germanium is 4.2% greater than that in the silicon. Conversely, Si deposition on germanium results in tensile straining this time of the silicon. In a complex operation (smart cut), such silicon layers are detached from the Ge and transferred onto a silicon substrate with oxide ($SiO_2$) cover layer whilst retaining the strain. These are so-called strained silicon on insulator (SSOI) structures. The oxide is additionally used for electrical insulation and allows the fabrication of all-around freestanding silicon nanowires, ultimately resulting in further improvements in the switching speeds and leakage current suppression of transistors on integrated CMOS circuits.

In principle, this method can be used to strain the silicon until the lattice constant of the Ge (4.2%) is attained. However, strains produced in practice are less than 1%. The limiting factor is the dislocation density which increases with strain.

Actuators and Specimens

Another approach is to be found in the field of materials characterization. Here, an actuator material which must exhibit a pre-induced tensile strain is applied to a substrate, but is separated therefrom by a sacrificial layer. The specimen material is applied between the actuator and a fixed point.

When the actuator and specimen are detached from the substrate, by dissolving of the sacrificial layer, the actuator is relaxed and the specimen therefore exhibits tensile strain. This therefore constitutes a micro tensile test machine. It involves at least four materials and it is necessary to ensure good connections, particularly for the connection of specimen and actuator. The setup is also more complicated (cf. WO 2004/089811 A1).

Bent Ribs and Layers

By embedding a specimen layer in differentially pre-strained layers, and then detaching this compound from the substrate, tensile strain can be produced in the specimen layer. This approach is also related to the bimetallic.

Straining by External Forces

Another class of methods for imparting tensile strain involves the use of external forces. For example, a specimen material can be strained if it is applied to a membrane and said membrane is compressively strained. There are also approaches where bridges and/or ribs are bent by mechanical forces (e.g. using an AFM tip) and/or electromagnetic forces (e.g. capacitive), and therefore experience tensile strain.

BRIEF SUMMARY OF THE INVENTION

The object of the present invention is therefore to specify a semiconductor component and a method for the production thereof which will enable the required tensile strain values to be provided in order to shift the properties of the silicon and of the germanium in the direction of implementing direct bandgaps, i.e. maximizing electron mobility.

This object is achieved according to the invention by a semiconductor component comprising a substrate and a free-standing bridge structure detached from the substrate, wherein the strain state relevant to the functionality of the semiconductor component is provided by cross-section modulation in the freestanding and bilaterally connected bridge structure detached from the substrate in a pre-strained layer on the substrate.

The invention enables a tensile strain state to be adjusted, which eliminates the problems of the current background art. According to the inventive method, an already pre strained (tensile strain) layer applied to a substrate is used for this purpose. Bridge structures are inserted in this layer by means of lithography and etching processes. These bridges are connected at both ends to the layer and the underlying substrate and are therefore continuous. Their geometric shape is determined by the lithography and the etching of particular windows in the pre-strained layer. The bridges have cross section modulation. When the substrate is selectively etched, the bridge is undercut by the windows and becomes detached from the substrate. The geometric patterning of the cross section causes a redistribution of the originally homogeneous strain as soon as the bridges patterned in this manner are detached from the substrate, the bridge elements with a large cross section being relaxed at the expense of the elements having a smaller cross section. This process then results in the desired dramatic increase in the pre-strain in the central parts of the bridge (in the thin section of bridge).

Dumbbell-shaped bridge structures can be produced in this way. It should be noted that it is only possible to multiply stresses/strains originally present in the layer. The multiplication factor is specifically determined by the lengths, widths and depths or rather their ratios in the bridge structure. The bridge structure effectively experiences strain/stress modulation by cross-section modulation, wherein local relaxation and local straining result from the homogeneous and "global" pre-strain. Using the method described here, any local increases and reductions in the pre-strain are therefore possible in principle. The modulation profile of the strain along the bridge depends only on the pre-strain, the geometry and the degree of undercutting.

In an advantageous embodiment of the present invention, it is possible to provide, as a bridge structure, germanium on a silicon substrate and/or silicon or germanium on an insulator substrate, such as e.g. SOI, or germanium on insulator (GOI), whereby a laser can be implemented for monolithic integration into a silicon architecture surrounding the semiconductor component. This implementation represents an outright innovation in silicon-based CMOS technology. This likewise applies, in an advantageous embodiment of the present invention, to a pre-strained silicon and/or germanium layer on an insulator substrate whereby a transistor structure having a strained conducting channel is implemented. Said conducting channel now has an electron mobility corresponding to that in direct bandgap semiconductors.

In a preferred embodiment of the present invention, a wiring board, such as e.g. a printed circuit board (PCB), and/or an integrated circuit can be provided which have, as a substrate, a patterned specimen layer with thereon based strain modulation.

To adjust the desired physical properties of the particularly strongly tensile-strained section of the pre-strained specimen layer, the bridge structure and a window structure created below the bridge structure can exhibit thickness modulation. having rounded edges on the bridge structure and/or the window structure.

In another advantageous development of the present invention, the material of the bridge structure and of the substrate can comprise multilayer systems irrespective of its crystallographic orientation.

Because of the achievable tensile strain, the semiconductor component can also be implemented as a multi-quantum well (MQW) modulator or as a quantum cascade laser (QCL), which likewise constitute types hitherto impossible in conventional CMOS Si technology.

It should also be noted that the present invention offers extremely high degrees of freedom in respect of the implementable physical properties of the semiconductor component. Its functionality which is constituted by its nonlinear optical characteristics and/or its birefringence and/or its dielectric properties and/or its electrical properties and/or its band structure and/or its ferroelastic property can be achieved using the appropriately adjusted strain state.

Further advantageous embodiments of the present invention are set out in the remaining sub-claims.

BRIEF DESCRIPTION OF THE SEVERAL VIEWS OF THE DRAWING

Preferred exemplary embodiments of the present invention will now be explained in greater detail with reference to the accompanying drawings in which.

DESCRIPTION OF THE INVENTION

Figure 1:
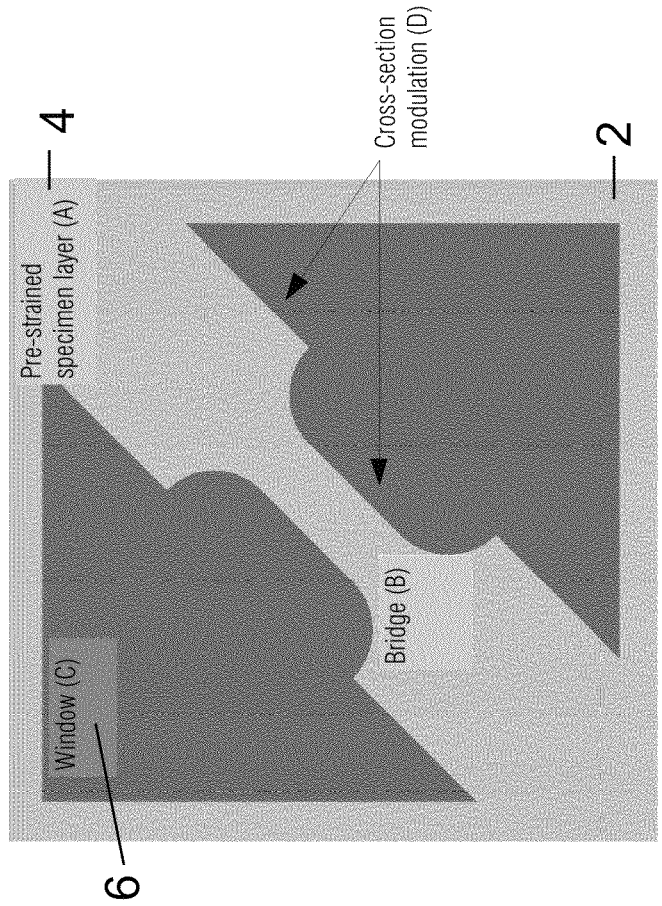
FIG. 1 schematically illustrates a first bridge structure having cross-section modulation.

A preferred exemplary embodiment on which the operation of the invention can be demonstrated consists of tensile-strained germanium 4 on a silicon substrate 2. The germanium has been applied by low energy plasma enhanced chemical vapor deposition. The window 6 has been defined by E-beam lithography and written into a PMMA mask. When the PMMA layer has developed, the mask is converted using $Cl_2$ gas into a Cr layer between PMMA and germanium layer 4. The window structure is imparted to the germanium 4 by reactive ion etching (e.g. ICP-RIE DRIE (deep reactive ion etching process using $CHF_3$, and $SF_6$). The bridge 8 shown in FIG. 1 is detached by selective undercutting by means of a potassium hydroxide solution at 80° C. and 20 w %.

Figure 2:
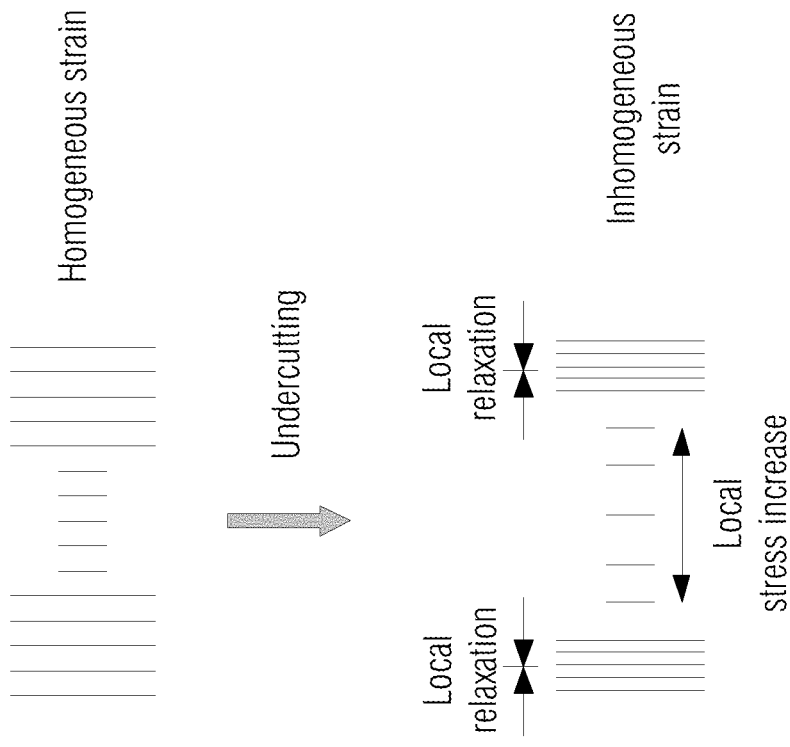
FIG. 2 schematically illustrates the inhomogeneous strain modulation by patterning and undercutting; lines schematically represent the lattice planes.

FIG. 2 schematically illustrates the inhomogeneous strain modulation by patterning and undercutting of the germanium 4. The lines schematically represent the lattice planes.

Figure 4:
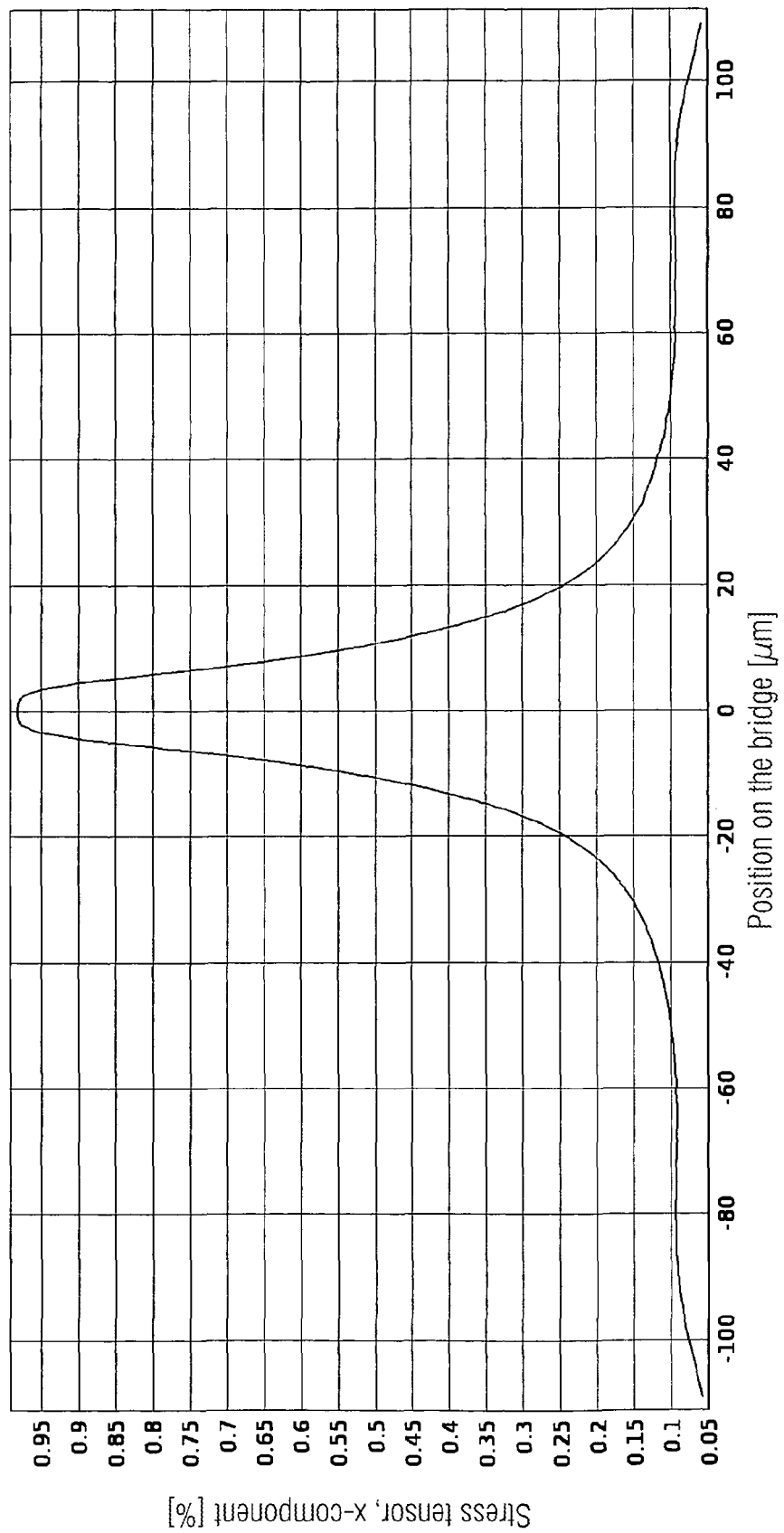
FIG. 4 shows the strain modulation of a bridge structure measured using Raman spectroscopy.

Various procedures have been examined, of which only the particularly preferred procedure is described here. The different approaches, including alternatives, are nevertheless covered in the claims. The bridges 8, and their detachedness, have been verified by scanning electron microscopy and the strain modulation confirmed by Raman spectroscopy (FIG. 4).

Figure 3:
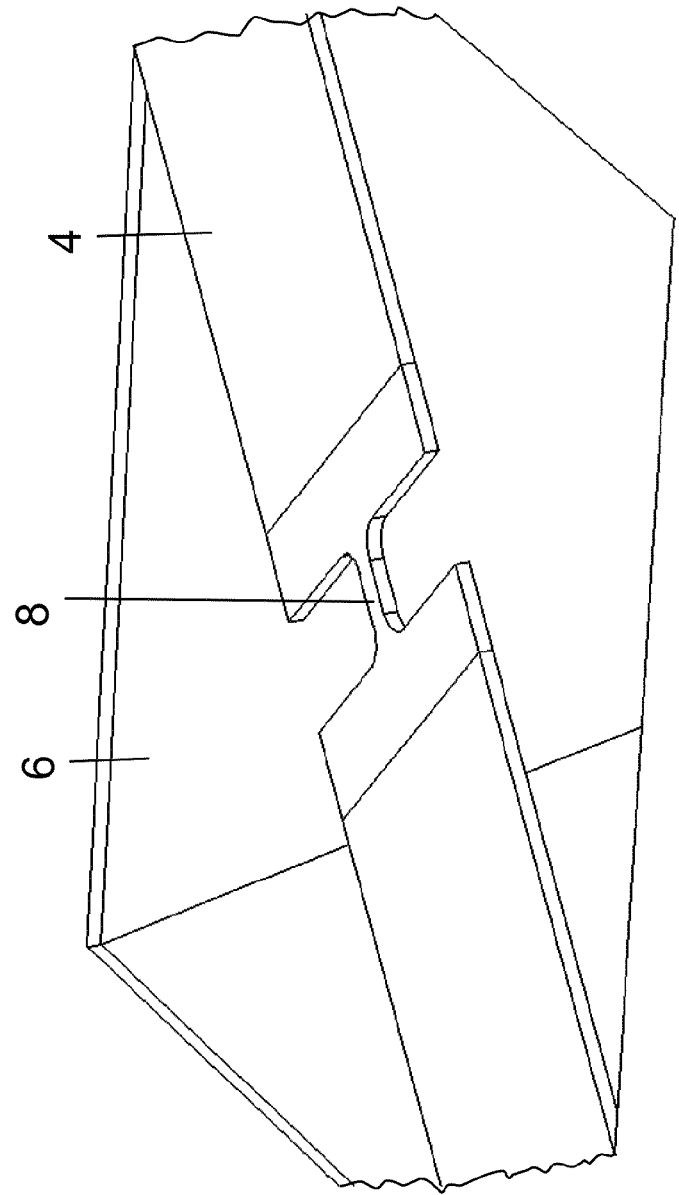
FIG. 3 shows a schematic 3D representation of an undercut bridge structure.

An alternative exemplary embodiment relates to strained silicon on oxide (SSOI). Here the corresponding windows are introduced into the silicon, again by reactive ion etching. In our example the bridge 8 is detached by isotropically etching hydrochloric acid (HCl) which only attacks the oxide, leaving the corresponding silicon bridge 8 free as shown in FIG. 3. In the case of a bridge 8 oriented in a particular crystallographic direction, the strain is uniaxial. This is the preferred strain for improving mobility. Isotropic etching enables bridges of any orientation or even curved bridges to be produced. This allows local and selective band structure modulations in the conduction band and valence band which can result in charge separation, for example, which could be used to produce more efficient solar cells or light detectors. The conduction and valence band selective band structure modulation could also be used to hole- and electron-based transistors into functional circuits.

Another alternative exemplary embodiment relates to bridges strained biaxially in typically two orthogonal directions. Here band structure effects could be increased still further. It is likewise possible to produce multiple bridges, the strain being uniformly distributed over the bridges arranged in parallel. In nanometer-sized bridges, advantageous quantum effects could thus occur. Dissipative processes due to electron scattering could be effectively suppressed thanks to one-dimensional electron transport.

The invention claimed is:

1. A semiconductor component, comprising:
   a substrate and a pre-strained layer formed on said substrate, said pre-strained layer originally having a given tensile strain;
   a freestanding bridge structure lithographically etched from said pre-strained layer and detached from said substrate;
   said bridge structure having a cross-section modulation defining a strain state relevant to a functionality of the semiconductor component, said cross-section modulation being formed in the freestanding and bilaterally connected bridge structure detached from said substrate in said pre-strained layer on said substrate with an increased strain on central parts of said bridge structure being increased, upon having been disconnected from said substrate, relative to the original tensile strain in said pre-strained layer.

2. The semiconductor component according to claim 1, wherein said bridge structure is a germanium bridge on a silicon substrate and/or a silicon or germanium bridge on an insulator substrate (e.g. SOI or GOI), providing lasing properties enabling a laser to be monolithically integrated into a silicon architecture.

3. The semiconductor component according to claim 1, wherein a pre-strained silicon and/or germanium layer is provided on an insulator substrate, thereby implementing a transistor structure having a pre-strained conducting channel.

4. The semiconductor component according to claim 1, wherein a wiring board and/or an integrated circuit is provided having, as a substrate, a patterned specimen layer with thereon based strain modulation.

5. The semiconductor component according to claim 4, wherein said wiring board is a printed circuit board (PCB).

6. The semiconductor component according to claim 1, wherein said bridge structure and a window structure formed below said bridge structure have a thickness modulation with rounded edges on one or both of said bridge structure or said window structure.

7. The semiconductor component according to claim 1, wherein a material of said bridge structure and of said substrate comprises multilayer systems irrespective of a crystallographic orientation thereof.

8. The semiconductor component according to claim 1, configured as a multi-quantum well (MQW) modulator or a quantum cascade laser (QCL).

* * * * *